United States Patent
Seymour

(10) Patent No.: US 6,922,165 B2
(45) Date of Patent: Jul. 26, 2005

(54) METHOD AND CIRCUIT FOR GAIN AND/OR OFFSET CORRECTION IN A CAPACITOR DIGITAL-TO-ANALOG CONVERTER

(75) Inventor: Robert E. Seymour, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/689,825

(22) Filed: Oct. 20, 2003

(65) Prior Publication Data

US 2005/0083221 A1 Apr. 21, 2005

(51) Int. Cl.[7] .............................................. H03M 7/12
(52) U.S. Cl. ...................................... 341/172; 341/150
(58) Field of Search ................................ 341/172, 150, 341/144, 145, 143, 120

(56) References Cited

U.S. PATENT DOCUMENTS 6,259,392 B1 * 7/2001 Choi et al. .................. 341/150
6,600,437 B1 * 7/2003 Confalonieri et al. ....... 341/150

* cited by examiner

Primary Examiner—Peguy Jeanpierre
Assistant Examiner—Joseph Lauture
(74) Attorney, Agent, or Firm—W. Daniel Swayze, Jr.; W. James Brady; Frederick J. Telecky, Jr.

(57) ABSTRACT

A method and circuit for gain and/or offset correction in a CDAC circuit are provided. The gain and/or offset correction can be realized by adjusting the sampling capacitance of a capacitor array, with a positive array of the CDAC circuit being trimmed for gain correction, and a negative array of the CDAC circuit being trimmed for offset correction. Accordingly, corrections to variations in gain and/or offset caused by process variations can be suitably addressed. To facilitate gain correction, an exemplary CDAC circuit comprising an N-bit capacitor array includes on the positive side of the capacitor array an additional capacitor configured to capture the sampling voltage. An exemplary CDAC circuit can also be configured to have one or more capacitors shifted out of the total capacitance of the capacitor array, and thus reduce the amount of charge stored during sampling. To facilitate offset correction, an exemplary CDAC circuit comprises a negative side having a capacitor array, wherein the CDAC circuit is configured to provide a desired amount of offset voltage through sampling of some of the capacitance in the negative side to a reference voltage, and sampling a remainder of the capacitance in the negative side to ground.

25 Claims, 9 Drawing Sheets

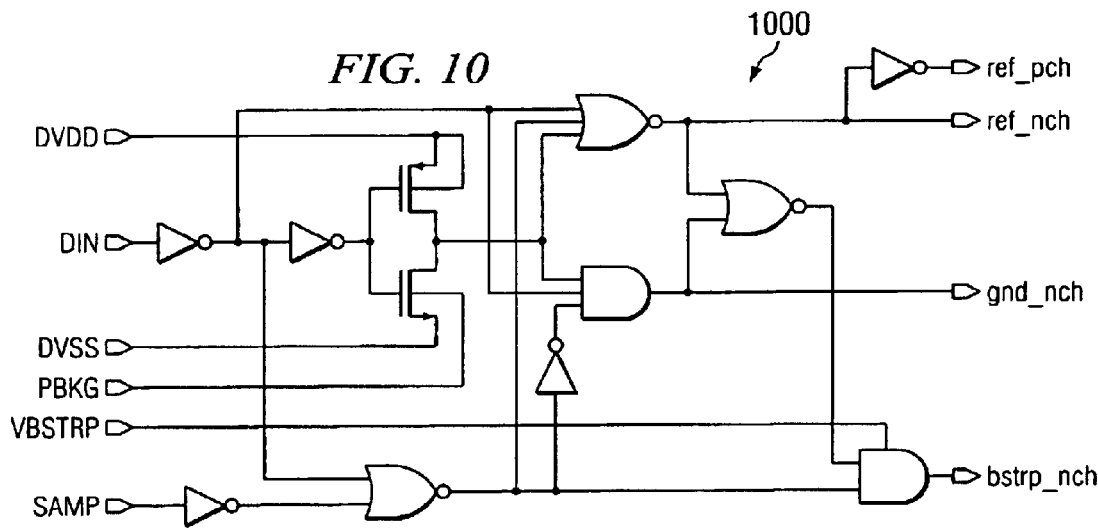
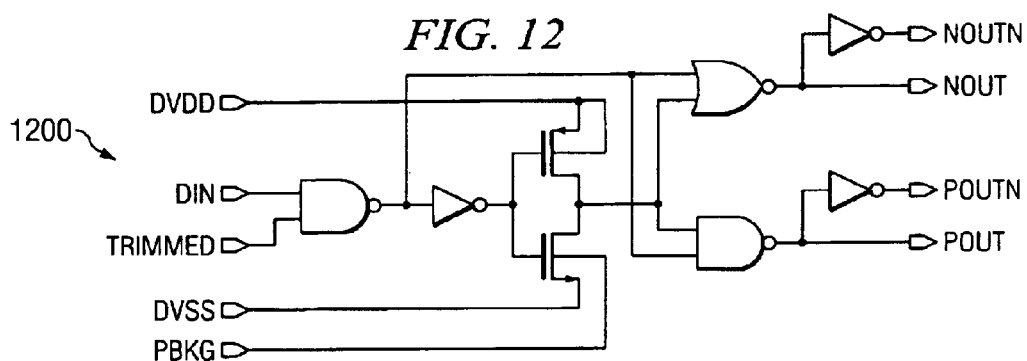
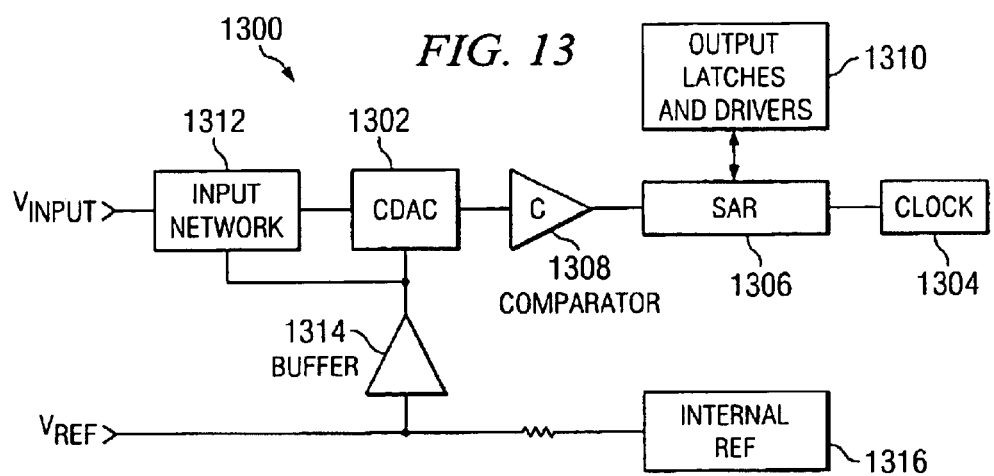

METHOD AND CIRCUIT FOR GAIN AND/OR OFFSET CORRECTION IN A CAPACITOR DIGITAL-TO-ANALOG CONVERTER

FIELD OF INVENTION

The present invention relates to a capacitor digital-to-analog converter (CDAC) for use in integrated circuits. More particularly, the present invention relates to a method and circuit for gain and/or offset correction in a CDAC circuit.

BACKGROUND OF THE INVENTION

The demand for more reliable analog-to-digital converters (ADCs), digital-to-analog converters (DACs), and related components for use in communication, data acquisition, and battery-operated applications continues to increase. As a result, integrated circuit manufacturers are requiring for such converters and devices to continue to improve their operating performance to meet the design requirements of a myriad of emerging applications.

Capacitor digital-to-analog converters (CDACs) are used frequently in high precision analog-to-digital converter applications. Over the years, many efforts have focused on improvements to the linearity of such CDAC devices. For example, many new techniques have been developed to facilitate the trimming of capacitor values of capacitors C to $C/2^{N-1}$ within the CDAC to improve linearity. Many applications adjust each capacitor such that the relationship between any two successive capacitors within the array is maintained within a fraction of a least significant bit (LSB) of accuracy, thus maintaining linearity.

Unfortunately, current designs and techniques have generally refrained from addressing gain and offset problems and instead have simply accepted the levels of precision that could be obtained. In some instances, empirical adjustments have been made to the CDAC to improve offset, such as by changing the physical size of pedestal switches to address charge injections and other non-ideal characteristics that can make offset unpredictable. However, such empirical techniques require layout changes and only improve offset to a level that is minimally acceptable, and most importantly do not address gain errors. Accordingly, previous design requirements have demanded less restrictive gain and offset specifications, and focused more on linearity complications.

The range of a CDAC circuit is defined by the smallest value of the input signal that produces a meaningful output signal from the CDAC up to the largest input signal that will produce a meaningful output signal. While linearity is determined by the binary relationship between any two successive capacitors, the range of the CDAC circuit is determined by the amount of capacitance that is sampled versus the total amount of capacitance in the entire CDAC circuit. For example, with reference to FIG. 1, an exemplary CDAC circuit 100 having a capacitor array of 16 bits, e.g., capacitors C to $C/2^{15}$ and sample switches $S_0$–$S_{15}$, can be configured to enable sampling of sampling voltage $V_{SAMPLE}$ on all 16 capacitors, C to $C/2^{15}$. In addition, to facilitate sampling of CDAC circuit 100, a pedestal switch $S_P$ can couple capacitors C to $C/2^{15}$ to a known pedestal voltage $V_{PEDESTAL}$, with the amount of sampled voltage $V_{SAMPLE}$ equal to a positive sample voltage $V_{POSITIVE}$ less pedestal voltage $V_{PEDESTAL}$, i.e., $V_{POSITIVE}-V_{PEDESTAL}$. CDAC circuit 100 provides a total capacitance weight of 2C due to the binary weighting, with the range equaling approximately a reference voltage $V_{REF}$. With reference to FIG. 2, an exemplary CDAC circuit 200 having 16 bits can also be configured to enable sampling of sampling voltage $V_{SAMPLE}$ only on first capacitor C, with the range equaling approximately two times reference voltage $V_{REF}$, or sampling of sampling voltage $V_{SAMPLE}$ only on second capacitor C/2, with the range equaling approximately four times reference voltage $V_{REF}$.

In both CDAC circuits 100 and 200, while the range can be configured through a mask change by choosing the particular capacitor to sample on in such a weight as to adjust the range, such CDAC circuits do not allow for correction of gain errors nor offset errors on an individual part basis. Furthermore, in applications in which it is desirable for CDAC circuits to be compatible with older converter circuits, the ability to ideally match process variations, such as the effects caused by input resistor networks that scale the input range, absolutely requires the CDAC circuits to have the ability to correct for the gain and offset. Unfortunately, present CDAC circuits are incapable of such correction techniques.

SUMMARY OF THE INVENTION

In accordance with various aspects of the present invention, a method and circuit for gain and/or offset correction in a CDAC circuit are provided. In accordance with one aspect of the present invention, the gain and/or offset correction can be realized by adjusting the sampling capacitance of a capacitor array, with a positive array of the CDAC circuit being trimmed for gain correction, and a negative array of the CDAC circuit being trimmed for offset correction. Accordingly, corrections to variations in gain and/or offset caused by process variations can be suitably addressed.

In accordance with an exemplary embodiment, to facilitate gain correction, an exemplary CDAC circuit comprising an N-bit capacitor array includes on the positive side of the capacitor array an additional capacitor configured to capture the sampling voltage. The additional capacitor can be coupled between a sampling voltage and ground to suitably increase an amount of charge sampled, thus decreasing the value of an input signal necessary to achieve full charge levels. In other words, the additional capacitor can suitably reduce the positive full-scale voltage necessary to achieve the full-scale digital code, thus changing the high end of the range to less than the reference voltage.

In accordance with an exemplary embodiment, an exemplary CDAC circuit can also be configured to have one or more capacitors shifted out of the total capacitance of the capacitor array, and thus reduce the amount of charge stored during sampling. Thus, after reducing the range to less than the reference voltage through sampling with the additional capacitor, the CDAC circuit can also be configured to incrementally increase the range back to the reference voltage. In other words, through connecting the additional capacitor to ground during conversion, and with and without sampling on all capacitors of the capacitor array, the positive full-scale range can be adjusted. Further, increasing and decreasing the range to a desired level can adjust the gain of the CDAC circuit to correct for gain errors.

In accordance with an exemplary embodiment, to facilitate offset correction, an exemplary CDAC circuit comprises a negative side having a capacitor array, wherein the CDAC circuit is configured to provide a desired amount of offset voltage through sampling of some of the capacitance in the negative side to a reference voltage, and sampling a remainder of the capacitance in the negative side to ground. The overall CDAC circuit will suitably converge to a desired offset voltage as determined by the amount of capacitance that samples the reference voltage. Thus, rather than simply converging to a fixed offset voltage, the overall CDAC circuit will suitably converge to a particular offset voltage as determined by the negative side capacitor array. As a result, by implementing a desired offset voltage into the CDAC circuit, any offset errors due to process variations, layout parasitic characteristics or charge injections can be suitably corrected on a part-by-part basis.

BRIEF DESCRIPTION OF THE DRAWINGS

A more complete understanding of the present invention may be derived by referring to the detailed description and claims when considered in connection with the Figures, where like reference numbers refer to similar elements throughout the Figures, and:

FIG. 10 illustrates a schematic diagram of an exemplary logic module for a positive switch circuit in accordance with an exemplary embodiment of the present invention;

FIG. 12 illustrates a schematic diagram of an exemplary logic module for a negative switch circuit in accordance with an exemplary embodiment of the present invention; and FIG. 13 illustrates a schematic diagram of an exemplary ADC circuit for gain and/or offset correction in accordance with an exemplary embodiment of the present invention.

DETAILED DESCRIPTION OF EXEMPLARY EMBODIMENTS OF THE INVENTION

The present invention may be described herein in terms of various functional components. It should be appreciated that such functional components may be realized by any number of hardware or structural components configured to perform the specified functions. For example, the present invention may employ various integrated components, such as buffers, current mirrors, and logic devices comprised of various electrical devices, e.g., resistors, transistors, capacitors, diodes and the like, whose values may be suitably configured for various intended purposes. In addition, the present invention may be practiced in any converter application. However for purposes of illustration only, exemplary embodiments of the present invention will be described herein in connection with CDAC circuits. Further, it should be noted that while various components may be suitably coupled or connected to other components within exemplary circuits, such connections and couplings can be realized by direct connection between components, or by connection through other components and devices located thereinbetween.

In accordance with various aspects of the present invention, a method and circuit for gain and/or offset correction in a CDAC circuit are provided. In accordance with one aspect of the present invention, the gain and/or offset correction can be realized by adjusting the sampling capacitance of a capacitor array, with a positive array of the CDAC circuit being trimmed for gain correction, and a negative side of the CDAC circuit being trimmed for offset correction. Accordingly, corrections to variations in gain and offset caused by process variations can be suitably addressed.

As discussed above, various methods and circuits are available for sampling on a capacitor array, including sampling on all capacitors such as CDAC circuit 100, or sampling on fewer capacitors such as CDAC circuit 200. Thus, currently available CDAC circuits can make the range approximately the reference voltage $V_{REF}$ up to approximately two times the reference voltage $V_{REF}$ by selectively choosing to sample on fewer capacitors. Unfortunately, such CDAC circuits cannot make the range smaller than the reference voltage $V_{REF}$.

Figure 1:
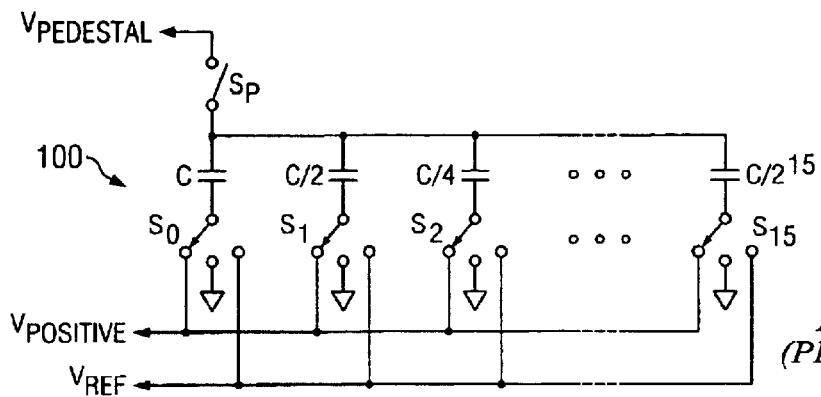
FIG. 1 illustrates a schematic diagram of a prior art CDAC circuit configured for sampling of all capacitors in a capacitor array to adjust range.
Figure 2:
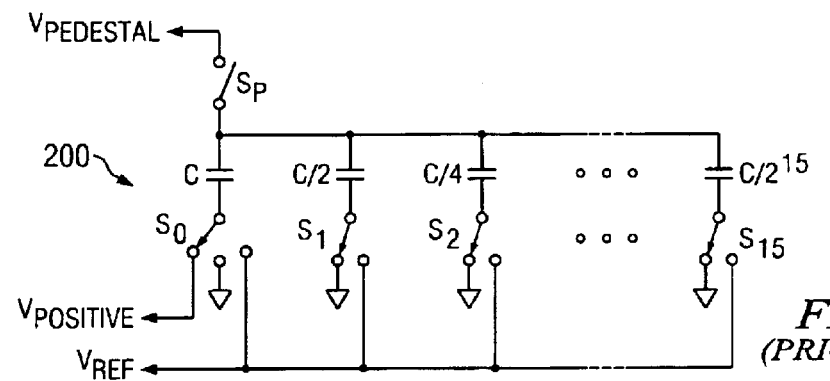
FIG. 2 illustrates a schematic diagram of a prior art CDAC circuit configured for sampling of only one capacitor in a capacitor array to adjust range.
Figure 3:
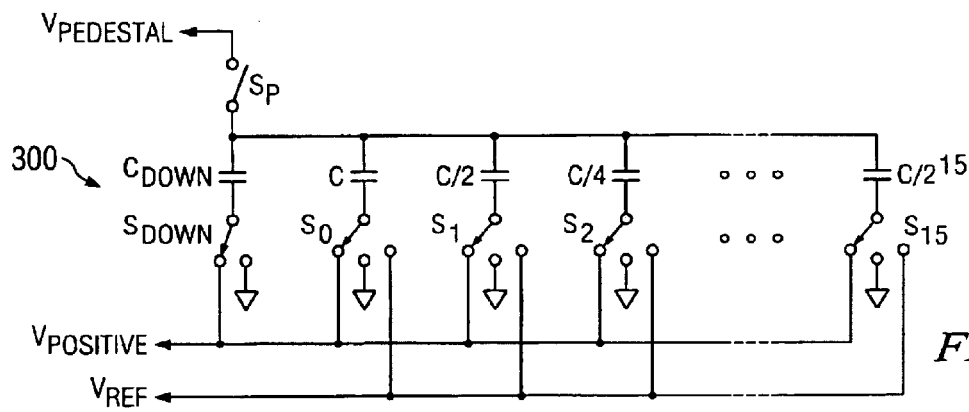
FIG. 3 illustrates a schematic diagram of a CDAC circuit for gain correction in accordance with an exemplary embodiment of the present invention.

In accordance with an exemplary embodiment, to facilitate gain correction, an exemplary CDAC circuit comprising an N-bit capacitor array includes on the positive side of the capacitor array, i.e., the side configured to sample a positive input signal, an additional capacitor configured to capture the sampling voltage. For example, with reference to FIG. 3, an exemplary CDAC circuit 300 includes a positive array circuit comprising a 16-bit array of capacitors C to $C/2^{15}$ and sampling switches $S_0$–$S_{15}$. CDAC circuit 300 can comprise any number N of capacitors in an array, and the 16-bit array is merely for illustrative purposes.

In addition, to facilitate sampling of CDAC circuit 300, a pedestal switch $S_P$ can couple capacitors C to $C/2^{15}$ to a known pedestal voltage $V_{PEDESTAL}$, with the amount of sampled voltage equal to a positive sample voltage $V_{POSITIVE}$ less pedestal voltage $V_{PEDESTAL}$, i.e., the amount of voltage sampled by CDAC circuit 300 is equal to $V_{POSITIVE}-V_{PEDESTAL}$. Pedestal voltage $V_{PEDESTAL}$ can comprise ground or zero volts, thus resulting in the amount of voltage sampled being equal to voltage $V_{POSITIVE}$. However, in many instances such as single supply voltage applications it can be advantageous to suitably configure pedestal voltage $V_{PEDESTAL}$ to comprise a value centered approximately between the positive and negative supplies to optimize biasing of other circuit components, such as the comparator. As will be discussed in detail below in accordance with another exemplary embodiment, any error created by the non-ground pedestal voltage $V_{PEDESTAL}$ can be corrected by the negative side of a CDAC circuit.

In accordance with the exemplary embodiment, CDAC circuit 300 further comprises an additional capacitor $C_{DOWN}$. Additional capacitor $C_{DOWN}$ can be coupled between sampling voltage $V_{SAMPLE}$ and ground by switch $S_{DOWN}$, with additional capacitor $C_{DOWN}$ being connected by switch $S_{DOWN}$ to sampling voltage $V_{SAMPLE}$ during sampling, and connected by switch $S_{DOWN}$ to ground during conversion. Additional capacitor $C_{DOWN}$ is suitably configured to increase an amount of charge sampled, thus decreasing the value of an input signal necessary to achieve full charge levels. In other words, additional capacitor $C_{DOWN}$ can suitably reduce the positive full-scale voltage necessary to achieve the full-scale digital code by pulling charge out of CDAC circuit 300, thus changing the positive end of the range. As a result, the range of CDAC circuit 300 can be made smaller than the reference voltage $V_{REF}$, i.e., additional capacitor $C_{DOWN}$ suitably drives the range of CDAC 300 down to less than the reference voltage $V_{REF}$.

The value and arrangement of additional capacitor $C_{DOWN}$ can be configured in various manners to achieve the desired range, and thus level of gain. For example, for a reference voltage equal 2.5 volts, CDAC circuit 300 can be configured to provide an accurate range of 0 to 2.5 volts through a smaller value for additional capacitor $C_{DOWN}$ to pull charge out, such as maybe approximately 50 LSBs of charge. The value of additional capacitor $C_{DOWN}$ would be suitably selected to reduce the range to a level approximate to or below reference voltage $V_{REF}$ to suitably allow for the expected or measured gain error, e.g., a gain error of approximately 3 mV. Thus, the value of additional capacitor $C_{DOWN}$ can be suitably selected during design to provide the approximate desired range, and then the precision level adjustment, e.g., in 1 LSB levels of adjustment, can be realized through shifting out of capacitance $C_{UP}$ during the testing process.

For example, for a range of between 0.3 volts and 2.2 volts, an exemplary additional capacitor $C_{DOWN}$ could be selected to be approximately 0.8 pF of capacitance. However, other values of capacitance for additional capacitor $C_{DOWN}$ could be suitably selected depending of the desired range and gain performance levels. In addition, capacitor $C_{DOWN}$ can comprise a single capacitor, or one or more capacitors in series and/or parallel. Accordingly, additional capacitor can comprise any value or arrangement configured to facilitate an increase in the amount of charge that is sampled, and thus a decrease in the amount of the input signal necessary to achieve full charge levels.

In accordance with another exemplary embodiment of the present invention, to incrementally increase the range back to the reference voltage $V_{REF}$, CDAC circuit 300 can be configured to sample on less than all capacitors C to $C/2^{15}$, making the range incrementally bigger based on the amount of capacitance that is not sampled, i.e., the amount of capacitance that is shifted out. For example, upon sampling all capacitors, the gain of CDAC circuit 300 can be suitably determined. If the gain is not acceptable for a desired application, then CDAC circuit 300 can be configured not to sample on one or more other capacitors. For example, capacitor C/4 can be shifted out by connecting capacitor C/4 between a pedestal voltage $V_{PEDESTAL}$ and ground, rather than sampling voltage $V_{SAMPLE}$. As a result, the non-sampled capacitor, e.g., capacitor C/4, is shifted out of the total capacitance to incrementally increase the range to a desired level of gain. If still insufficient, one or more capacitors from C to $C/2^{15}$, either alone or in addition to capacitor C/4, can be suitably shifted out to incrementally increase the range to the desired level of gain. Thus, while additional capacitor $C_{DOWN}$ can be configured to decrease the range to a level below reference voltage $V_{REF}$, the range can be suitably incremented by shifting out capacitance $C_{UP}$ to incrementally increase the range back to reference voltage $V_{REF}$.

For illustrative purposes, the capacitance shifted out of the total capacitance can be designated as capacitor $C_{UP}$. If the gain resulting from capacitor C/4 being shifted out is also not acceptable, then CDAC circuit 300 can be configured not to sample on one or more other capacitors C to $C/2^{15}$ on a part-by-part basis until the desired level of gain is achieved. In other words, a binary search for the appropriate combination of capacitors C to $C/2^{15}$ to sample can be selected to achieve the desired level of gain.

The range of CDAC circuit 300 can be represented by the equation:

$$0 < V_{SAMPLE} < (2*C*V_{REF})/(2*C - C_{UP} + C_{DOWN})$$

Wherein C is the value of the MSB capacitor, and 2*C represents the total capacitance of CDAC circuit 300 (excluding additional capacitor $C_{DOWN}$). As can be realized, for a conventional CDAC circuit 300 having no additional capacitor $C_{DOWN}$ and no capacitance $C_{UP}$ being shifted out, the range would be between 0 and reference voltage $V_{REF}$; for CDAC circuit 300 having an additional capacitor $C_{DOWN}$ and no capacitance $C_{UP}$ being shifted out, the range would be between zero volts and some voltage less than reference voltage $V_{REF}$; and for CDAC circuit 300 having an additional capacitor $C_{DOWN}$ and capacitance $C_{UP}$ being incrementally shifted out, the range could be incrementally varied between zero volts and approximately reference voltage $V_{REF}$. Thus, in effect, sampling with additional capacitor $C_{DOWN}$ can provide a "course" adjustment, and shifting out capacitance $C_{UP}$ can provide a "fine" adjustment.

Accordingly, through connecting additional capacitor $C_{DOWN}$ to ground during conversion to decrease the range, and with and without sampling on all capacitors C to $C/2^{15}$, i.e., changing the amount of capacitance $C_{UP}$ shifted out of the total capacitance to increase the range, the positive full-scale range can be suitably adjusted. Further, increasing and decreasing the range to a desired level can adjust the gain of CDAC circuit 300 to a desired level, thus correcting any errors in gain due to process variations.

While CDAC circuit 300 can be configured with additional capacitor $C_{DOWN}$ connected by switch $S_{DOWN}$ between sampling voltage $V_{SAMPLE}$ and ground, CDAC circuit 300 can also be configured with additional capacitor $C_{DOWN}$ connected by switch $S_{DOWN}$ between sampling voltage $V_{SAMPLE}$ and reference voltage $V_{REF}$. Thus, instead of pulling charge out, additional capacitor $C_{DOWN}$ can pump charge back into CDAC circuit 300. As a result, additional capacitor $C_{DOWN}$ can also be configured for changing the negative end of the range. In other words, only the minus full scale range is adjusted, with the positive end of the range remaining at approximately reference voltage $V_{REF}$.

Thus, connecting additional capacitor $C_{DOWN}$ to ground adjusts the upper end of the range, e.g., the range from zero up to reference voltage $V_{REF}$ plus or minus some adjustment levels. On the other hand, connecting additional capacitor $C_{DOWN}$ to reference voltage $V_{REF}$ adjusts the lower end of the range, e.g., the range from zero plus or minus some adjustment levels up to reference voltage $V_{REF}$. Accordingly, CDAC circuit 300 can be suitably configured in various manners for connecting additional capacitor $C_{DOWN}$ to ground or reference voltage $V_{REF}$ during conversion, and for shifting capacitance $C_{UP}$ shifted out of the total capacitance such that the upper or lower ends of the full scale range can be suitably adjusted. Further, increasing and decreasing the range to a desired level can adjust the gain of CDAC circuit 300 to a desired level, thus correcting any errors in gain due to process variations.

Figure 4A:
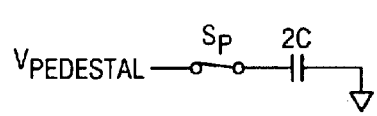
FIGS. 4A and B illustrate schematic diagrams of an exemplary circuit for a negative side of a CDAC circuit during sampling and conversion.
Figure 4B:
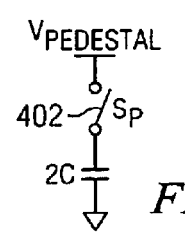

While the positive array of an exemplary CDAC circuit can be trimmed for gain correction, in accordance with another aspect of the present invention, the negative side of the CDAC circuit can be trimmed for offset correction. For currently available CDAC circuits, the negative side of the CDAC circuit generally does not participate in the conversion process. Instead, the negative side of the CDAC circuit serves to establish internal bias levels, and in particular the level of voltage that the positive CDAC circuit will converge to during the conversion process. For example, with reference to FIG. 4A, during sampling of the entire negative side of the CDAC circuit (as represented by a circuit comprising a capacitor 2C), a switch $S_{PN}$ can connect capacitor 2C between pedestal voltage $V_{PEDESTAL}$ and ground. During conversion, with reference to FIG. 4B, a node 402 previously connected by switch $S_{PN}$ to $V_{PEDESTAL}$ is allowed to float. As a result, a fixed voltage is established on the negative side ideally equal to $V_{PEDESTAL}$.

Figure 5:
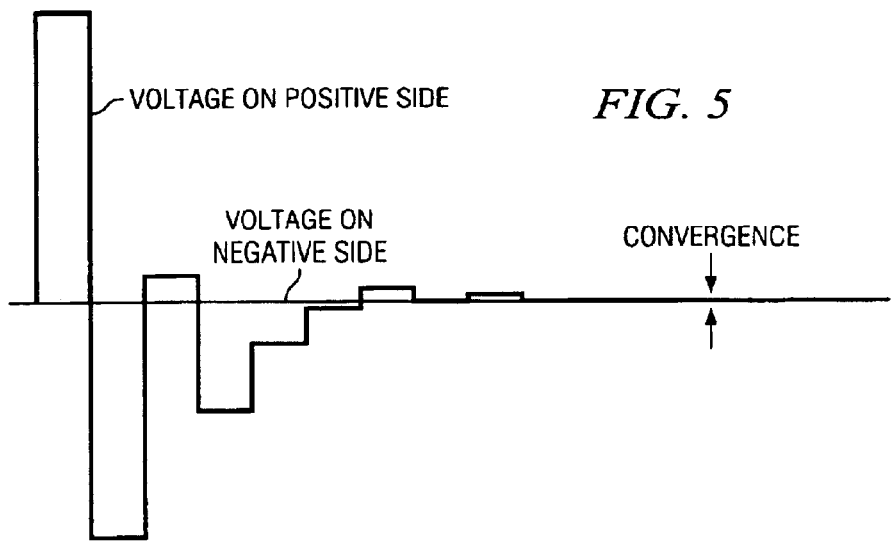
FIG. 5 illustrates a diagram of the convergence of the positive and negative side voltages of an exemplary CDAC circuit.

Thus, during sampling of this exemplary circuit, the entire capacitance 2C is sampled. During conversion, the negative side realizes some fixed level of offset voltage. However, the amount of voltage is not necessarily consistent with the amount of offset correction desired due to non-ideal effects such as parasitic capacitance, charge injection and others. For example, with reference to FIG. 5, during conversion the voltage on the positive side of the CDAC circuit converges to the fixed voltage established on the negative side. Unfortunately, due to the non-ideal effects above, the CDAC circuit converges to a wrong voltage resulting in an offset error.

Figure 6:
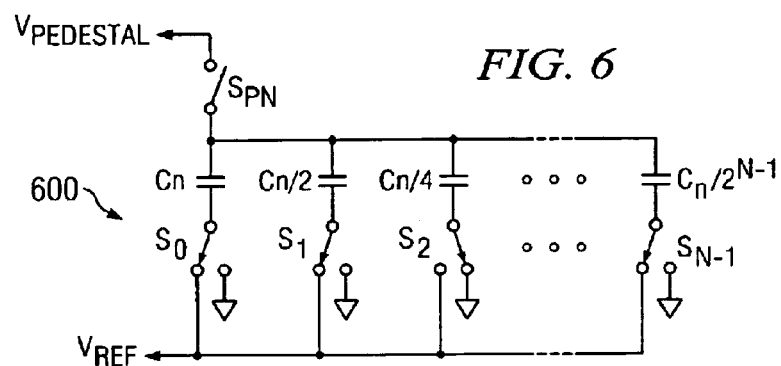
FIG. 6 illustrates a schematic diagram of an exemplary CDAC circuit for offset correction in accordance with an exemplary embodiment of the present invention.
Figure 7:
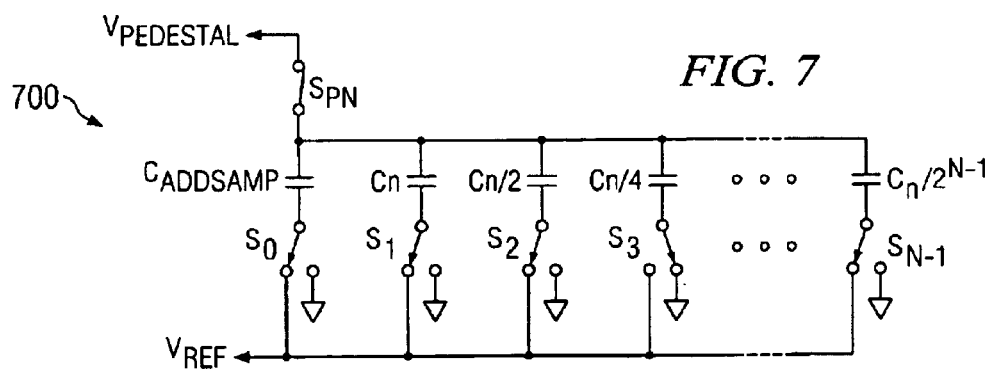
FIG. 7 illustrates a schematic diagram of an exemplary CDAC circuit for offset correction in accordance with another exemplary embodiment of the present invention.

However, in accordance with another aspect of the present invention, to facilitate offset correction, an exemplary CDAC circuit comprises a negative side having a capacitor array, wherein the CDAC circuit is configured to provide a desired amount of offset voltage through sampling of various of some of the capacitance in the negative side to a reference voltage, and sampling a remainder of the capacitance in the negative side to ground. For example, with reference to FIG. 6, an exemplary negative side of a CDAC circuit 600 can comprise an N-bit capacitor array including capacitors $C_n$ to $C_n/2^{N-1}$, having a total capacitance of 2 $C_n$. Offset trimming can be achieved by sampling some of capacitors $C_n$ to $C_n/2^{N-1}$ to reference voltage $V_{REF}$, e.g., capacitors $C_n$, $C_n$ and $C_n/2^{N-1}$, while sampling one or more other capacitors, e.g., capacitor $C_n/4$, to ground. During conversion, all $C_n$ to $C_n/2^{N-1}$ are connected to ground. As result, the amount of capacitance that samples reference voltage $V_{REF}$ controls the amount of offset voltage. In other words, the voltage offset can be realized by the equation:

$$V_{OFFSET} = C_{REFSAMP} * V_{REF}/(2*C_n)$$

wherein capacitance $C_{REFSAMP}$ represents the amount of capacitance that samples reference voltage $V_{REF}$, i.e., the total capacitance 2 $C_n$ less the amount of capacitance that is connected to ground during sampling.

Thus, rather than simply converging to a fixed offset voltage, the overall CDAC circuit will suitably converge to a particular offset voltage as determined by the negative side. In other words, the overall CDAC circuit will suitably converge to a desired offset voltage as determined by the amount of capacitance that sample reference voltage $V_{REF}$. The amount of capacitance that samples reference voltage $V_{REF}$ can be suitably selected similarly to the iterative process for incrementally shifting out capacitance $C_{UP}$ of CDAC circuit 300, i.e., determine the offset, and then increase or decrease the amount of capacitance that samples reference voltage $V_{REF}$ to further increase or decrease the amount of offset voltage $V_{OFFSET}$ until a desired level of voltage offset is achieved. As a result, by implementing a desired offset voltage into the CDAC circuit, any offset errors due to process variations, layout parasitic characteristics or charge injections can be suitably corrected on a part-by-part basis. In addition, the negative full scale range can be suitably adjusted to a desired lower level.

As discussed above, it may be advantageous in some instances for pedestal voltage $V_{PEDESTAL}$ to comprise a value centered approximately between the positive and negative supplies to optimize biasing of other circuit components, such as the comparator. In accordance with another exemplary embodiment, any error created by the non-ground pedestal voltage $V_{PEDESTAL}$ for use with the positive side of CDAC circuit 300 can be corrected by the negative side of CDAC circuit 600. For example, an analog-to-digital converter (ADC) can convert the signal sampled on the positive side of CDAC circuit 300 minus the signal sampled on the negative side of CDAC circuit 600. Since both sampled signals include pedestal voltage $V_{PEDESTAL}$, any non-zero pedestal voltage $V_{PEDESTAL}$ signal is suitably cancelled out, leaving the converted signal to be voltage $V_{POSITIVE}$ minus voltage $V_{NEGATIVE}$. As a result, pedestal voltage $V_{PEDESTAL}$ can be suitably selected to optimize various circuit components without affecting the integrity of the sampled voltage.

While the amount of capacitance that samples reference voltage $V_{REF}$ can be realized from within those selected among capacitors $C_n$ to $C_n/2^{N-1}$, the amount of capacitance that samples reference voltage $V_{REF}$ can also be realized from an additional capacitance. For example, with reference to a negative side of a CDAC circuit 700, an additional capacitance $C_{ADDSAMP}$ can be included with negative side of CDAC circuit 700, e.g., in a manner similar to additional capacitance $C_{DOWN}$ added to CDAC circuit 300. Accordingly, bi-directional adjustment of offset voltage $V_{OFFSET}$ can be achieved.

An exemplary CDAC circuit may be implemented within a wide variety of analog-to-digital converter (ADC) applications. For example, with reference to FIG. 13, in accordance with an exemplary embodiment, an exemplary ADC circuit 1300 can comprise a CDAC circuit 1302 configured with a clock 1304, a successive approximation register (SAR) and control logic 1306, and a comparator 1308 for facilitating analog-to-digital conversion of an input signal $V_{INPUT}$. ADC circuit 1300 can also comprise various latches and drivers 1310, buffers 1314 and or internal reference signals 1316. ADC circuit 1300 is merely one exemplary embodiment, and an exemplary CDAC circuit configured for gain and/or offset correction can be configured in any ADC circuit arrangement, now known or hereinafter devised.

Figure 8A:
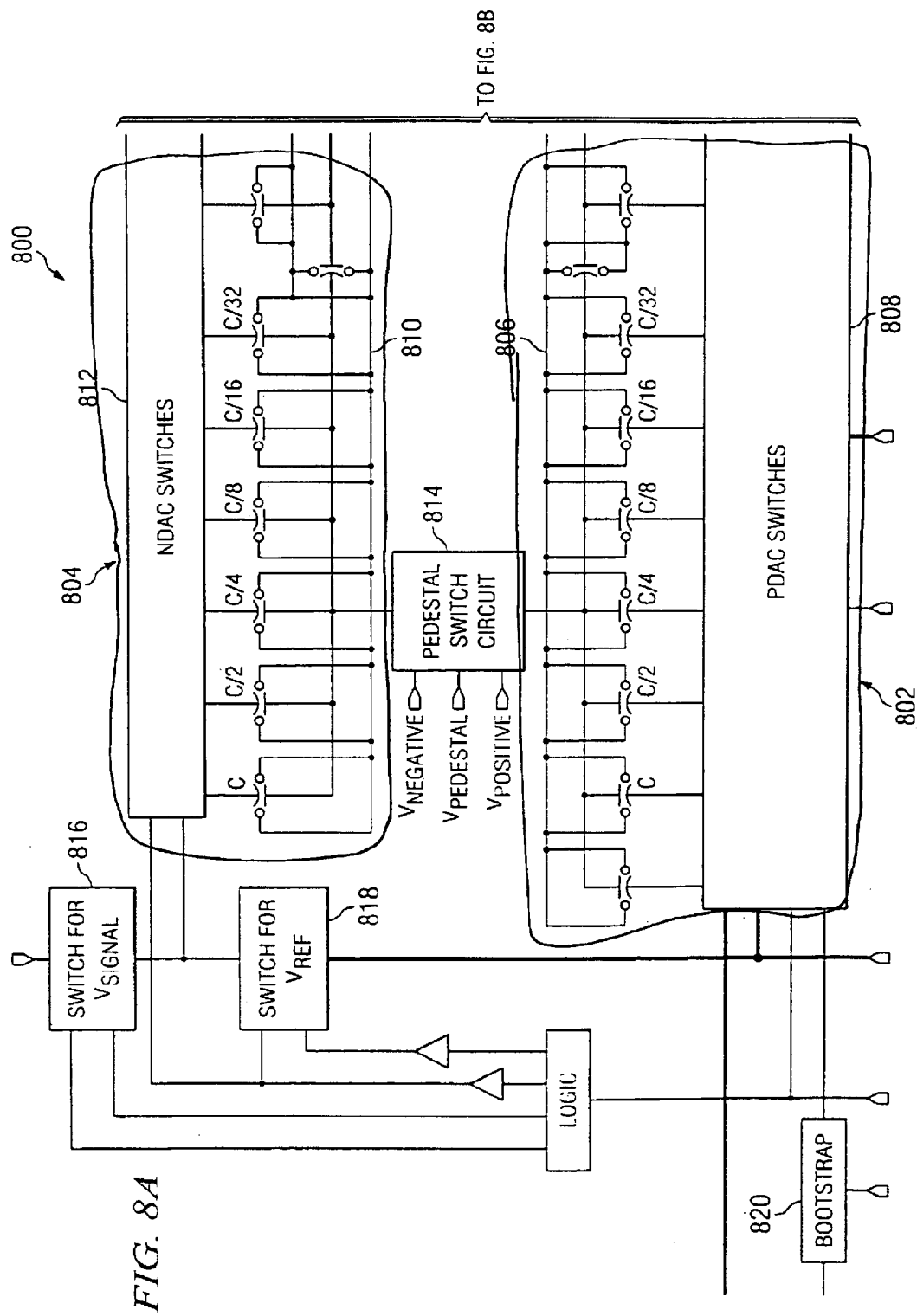
FIGS. 8A and 8B illustrate a schematic diagram of an exemplary CDAC circuit for gain and offset correction in accordance with an exemplary embodiment of the present invention.
Figure 8B:
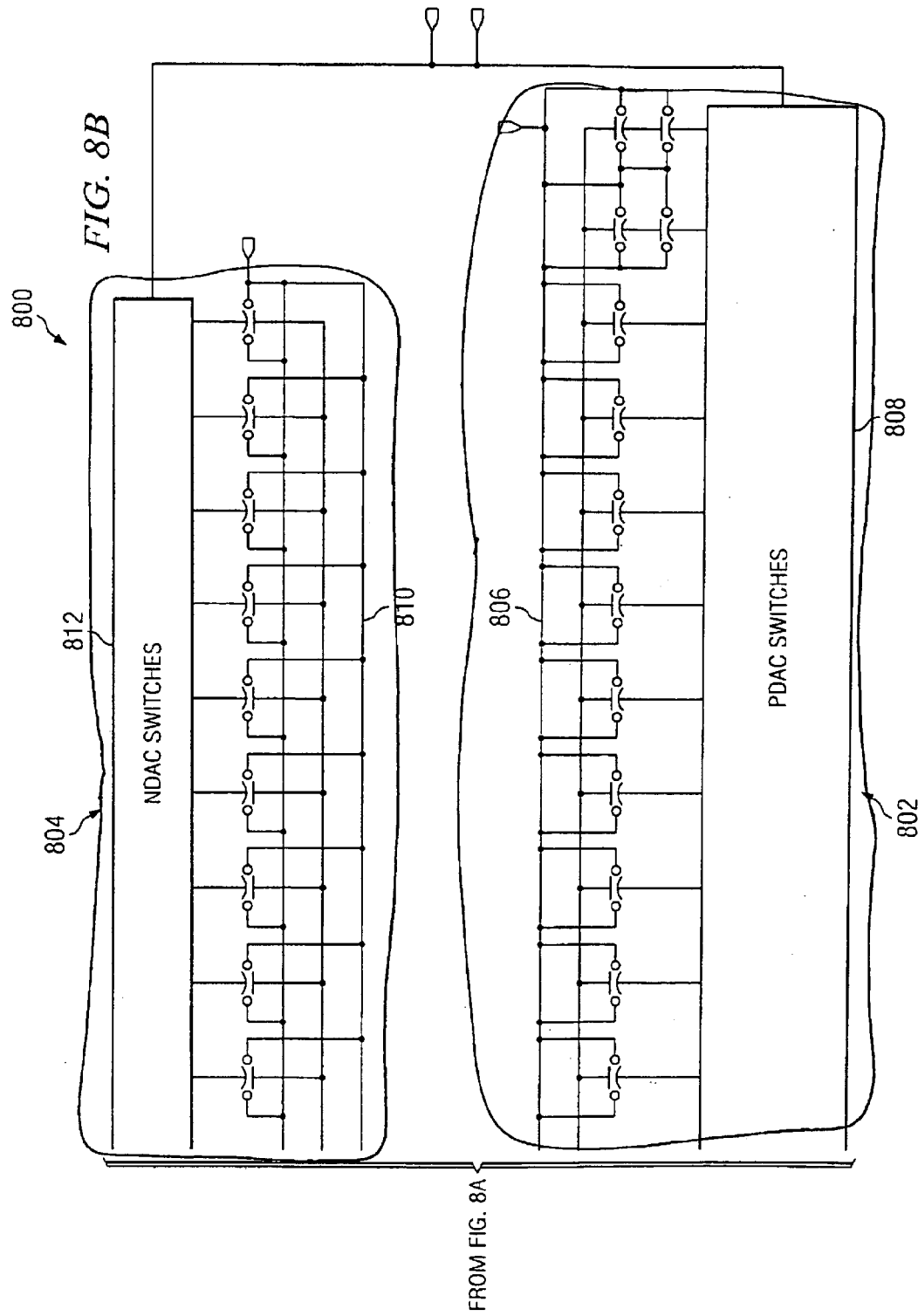

An exemplary CDAC circuit can also comprise various other components and devices in addition to the capacitor array circuits on the positive and/or negative sides of the CDAC circuit. For example, with reference to FIGS. 8A and 8B, an exemplary CDAC circuit 800 configured for both gain and offset correction within an ADC circuit can comprise both a positive side CDAC circuit 802 and a negative side CDAC circuit 804 are illustrated. Positive side circuit 802 includes a positive capacitor array 806 and positive switch circuit 808, while negative side circuit 804 includes a negative capacitor array 810 and negative switch circuit 812. Positive capacitor array 806 comprises an additional capacitor CDOWN configured to facilitating adjustment of the range to a desired level to suitably control the gain of CDAC circuit 800. Although the exemplary embodiment includes both gain and offset correction, CDAC circuit 800 could also comprise only one of gain correction or offset correction.

In addition, CDAC circuit 800 can also comprise a pedestal switch circuit 814 comprising one or more pedestal switches to facilitate sampling of CDAC circuit 800 relative to a known second voltage, $V_{PEDESTAL}$. Pedestal switch circuit 814 can comprise various configurations, now known or hereinafter devised, for providing switching functions.

Figure 9A:
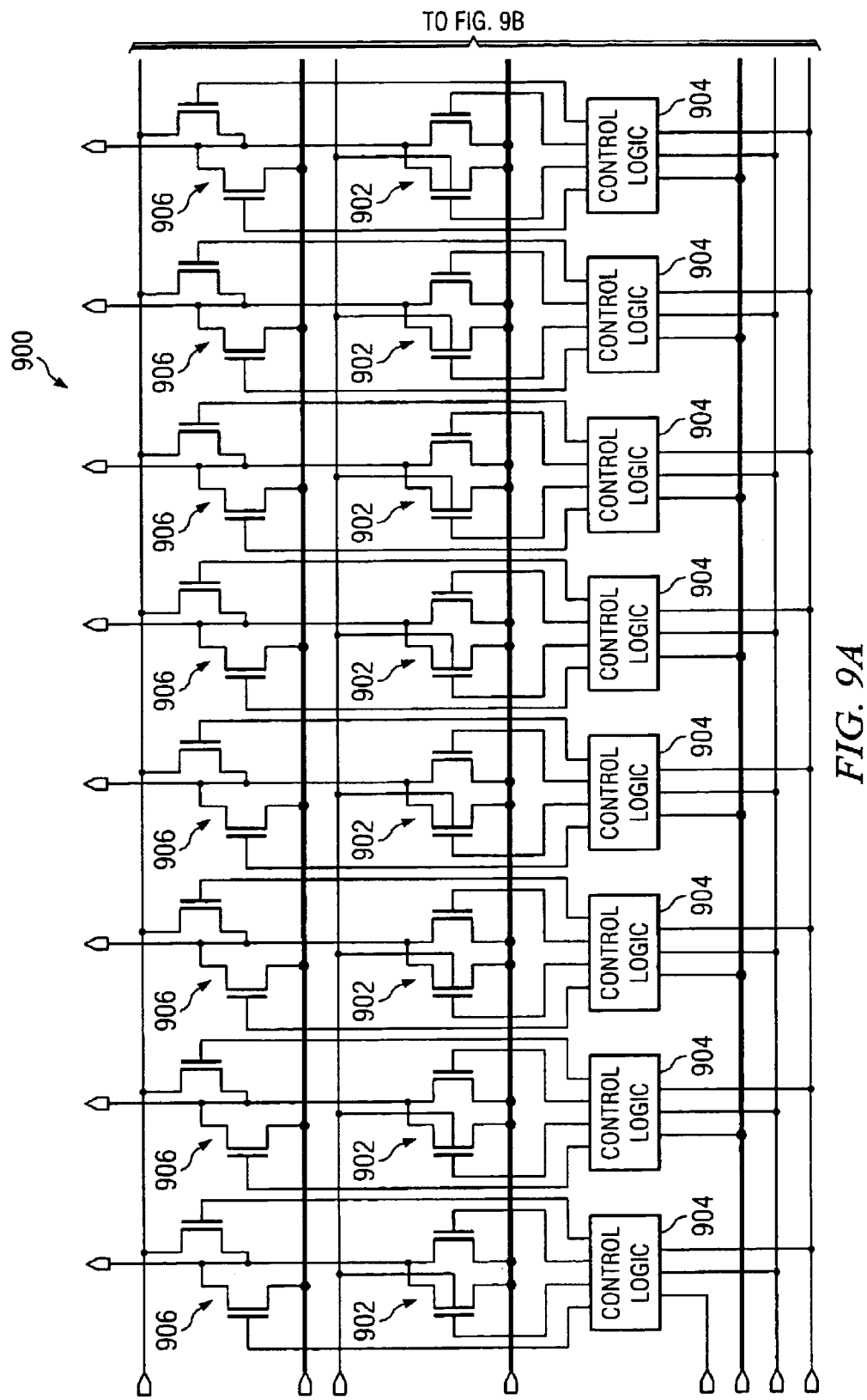
FIGS. 9A and 9B illustrate a schematic diagram of an exemplary positive switch circuit in accordance with an exemplary embodiment of the present invention.
Figure 9B:
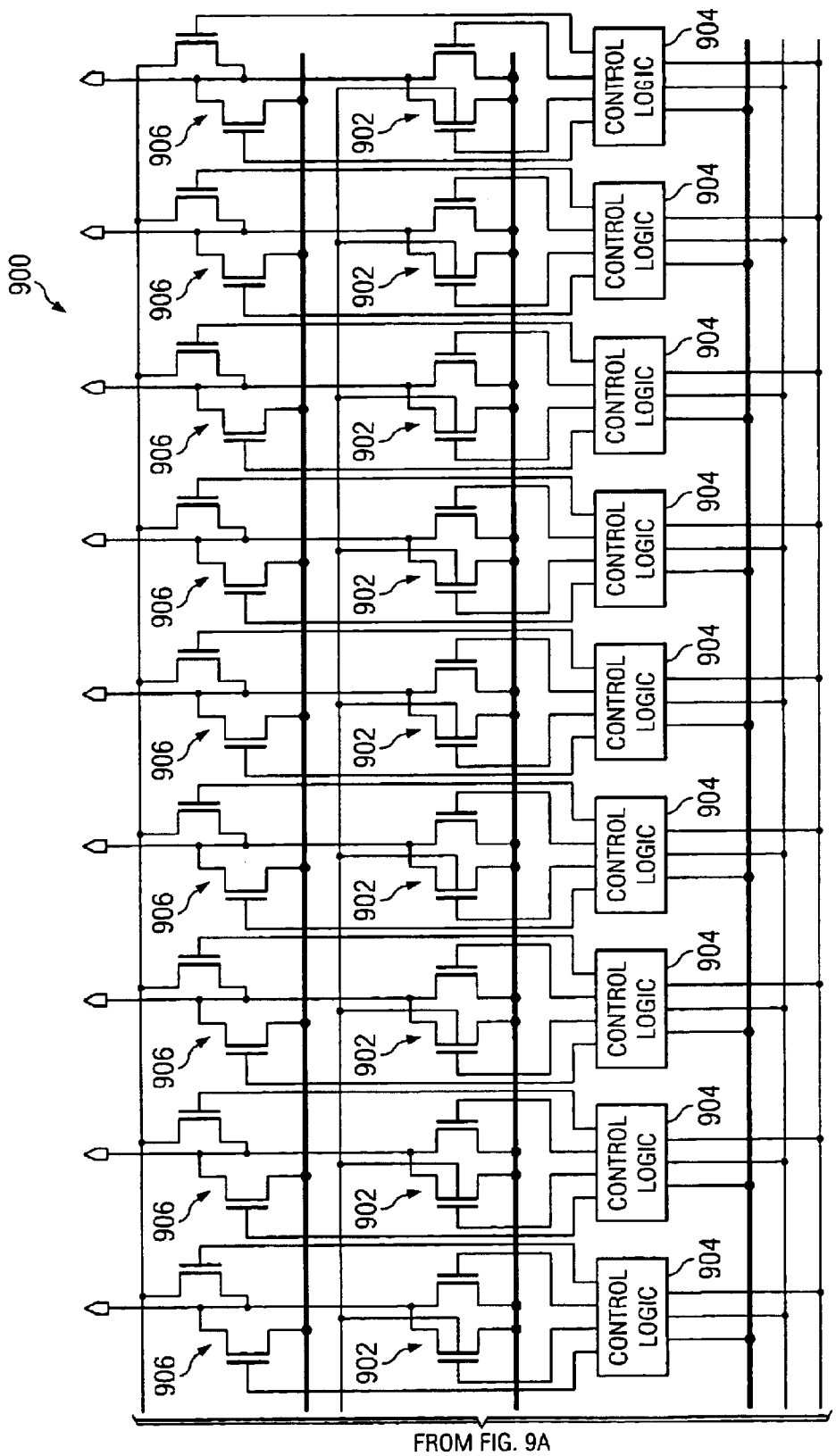
Figure 11A:
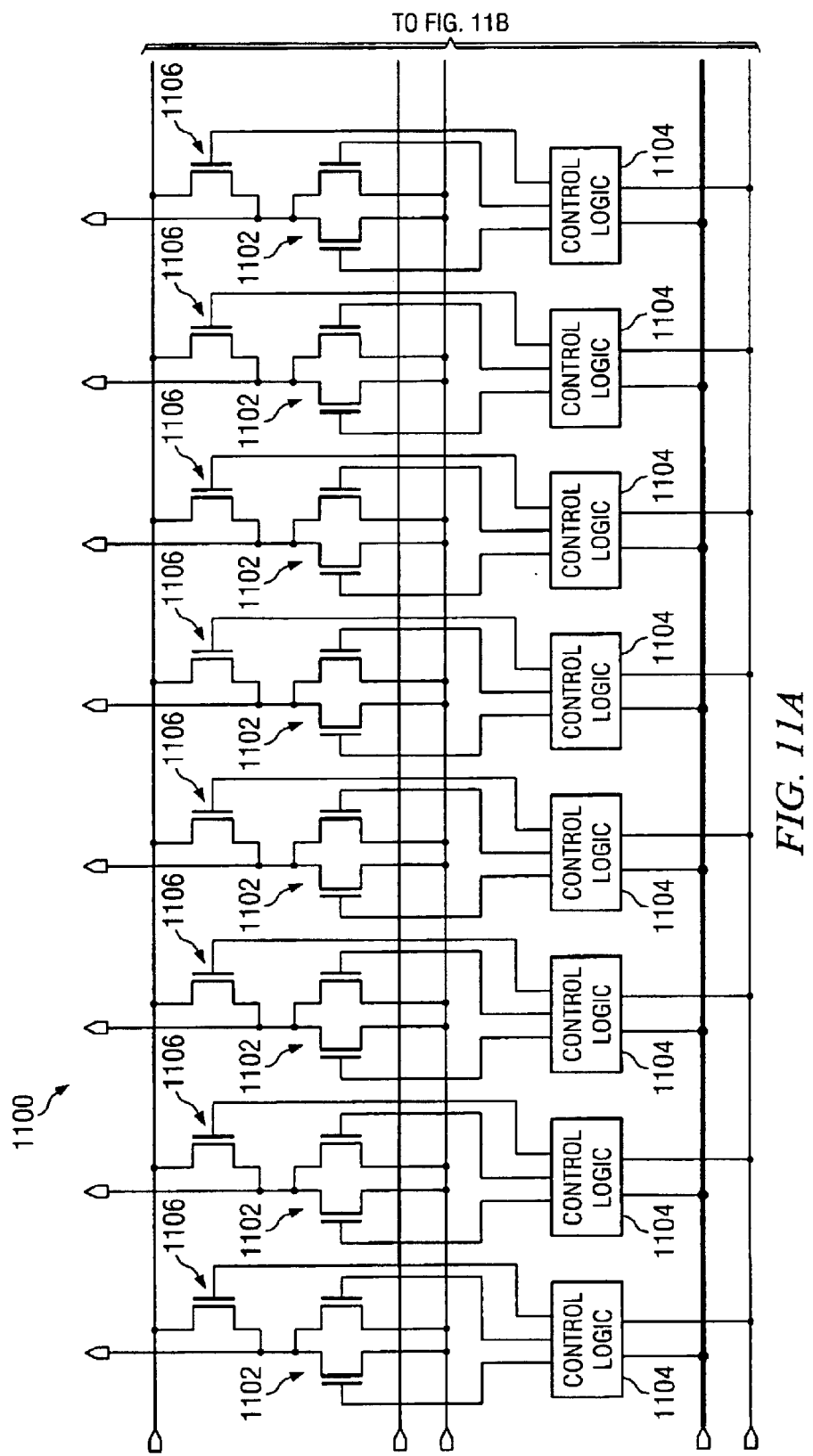
FIGS. 11A and 11B illustrate a schematic diagram of an exemplary negative switch circuit in accordance with an exemplary embodiment of the present invention.
Figure 11B:
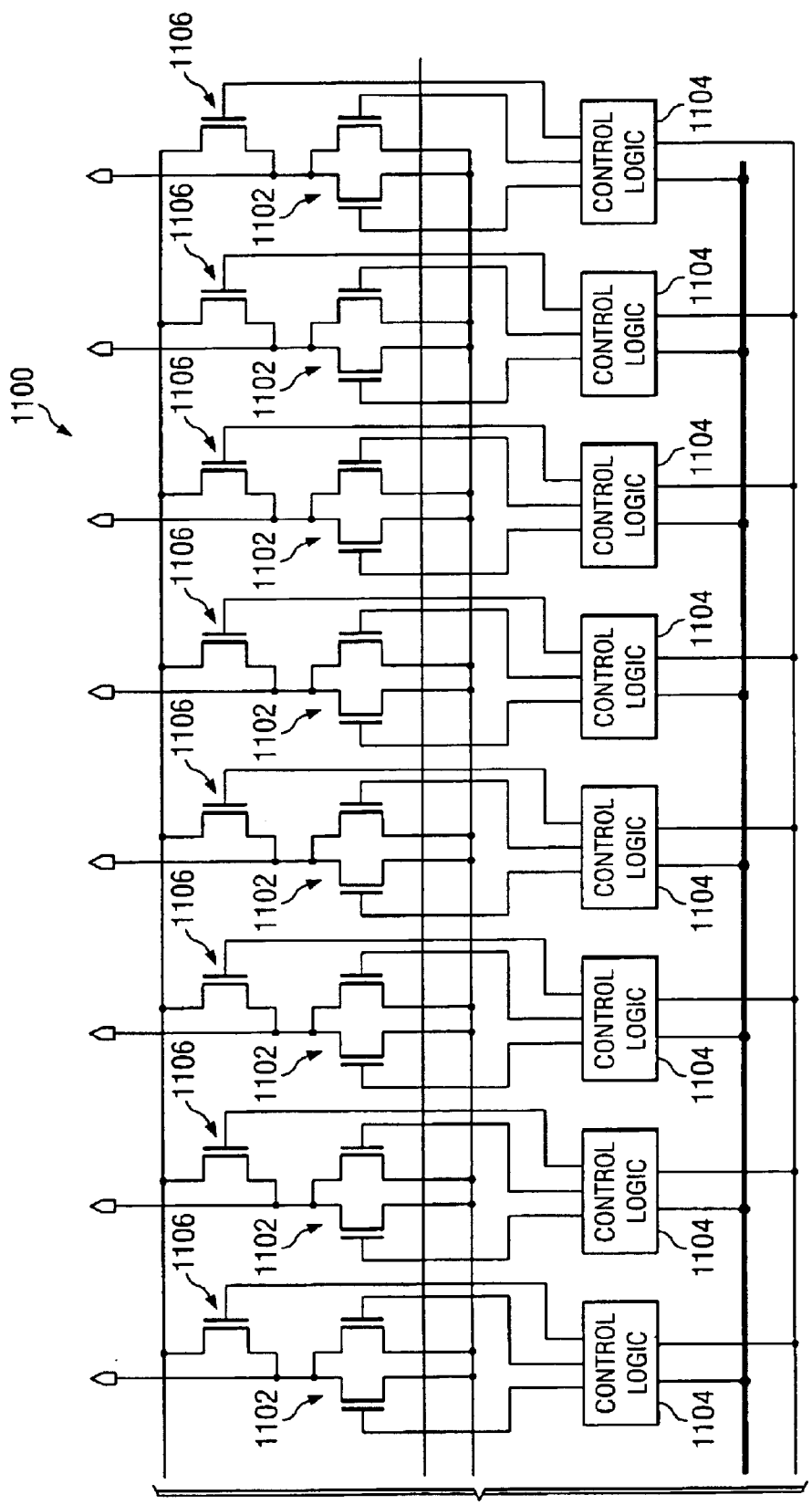

Positive switch circuit 808 and negative switch circuit 812 can be configured in various manners for facilitating switching operation of capacitor arrays 806 and 810, respectively. For example, with reference to FIGS. 9A and 9B, a positive switch circuit 900 can comprise a plurality of switch modules 902 configured for coupling through a plurality of switching transistors 906 to corresponding capacitors of capacitor array 806. For control of operation, positive switch circuit 900 can comprise one or more control logic modules 904 coupled to plurality of switch modules 902. Likewise, with reference to FIGS. 11A and 11B, a negative switch circuit 1100 can comprise a plurality of switch modules 1102 configured for coupling through a plurality of switching transistors 1106 to corresponding capacitors of capacitor array 810. For control of operation, positive switch circuit 1100 can comprise one or more control logic modules 1104 coupled to plurality of switch modules 1102.

Switch modules 902 and 1102 can comprise any switching configuration, now known or hereinafter devised for facilitating switching of capacitor arrays. In addition, control logic modules 904 and 1104 can also be configured in various manners for providing operating logic for control of switching operation of switch modules 902 and 1102. For example, with reference to FIGS. 10 and 12, control logic module 1000 for control of one or more switch modules 902 and control logic module 1100 for control of one or more switch modules 1102 can comprise a plurality of logic devices, e.g., inverters, AND/NAND gates, exclusive OR gates (XOR) or any other like logic devices, with and without additional switching transistors, to provide control of switching modules 902 and 1102, respectively. Further, control logic modules 1000 and 1100 can comprise any logic combination, and any number of logic devices, for control of switch modules 902 and 1102.

In accordance with an exemplary embodiment, to facilitate a smoother switching operation and to minimize potential distortion caused by operation of positive switch circuit 808, CDAC circuit 800 can also comprise a bootstrap module 820. Bootstrap module 820 is configured to maintain constant the gate-source voltage $V_{GS}$ on switching transistors with a varying signal, thus keeping the impedance of the switching transistors constant. Bootstrapping module 820 can comprise a single module coupled to switch circuit 808, and/or through a plurality of modules coupled to switch modules 902, such as switching transistors 906 within positive switching module 900. For example, with additional reference to FIG. 10, bootstrapping module 820 can regulate a voltage signal VBSTRP to regulate an on-state voltage of output signal "bstrp_nch" that control n-channel switching transistors 906, e.g., when bootstrapping module 820 is turned off, output signal "bstrp_nch" is at a ground condition, thus driving n-channel switching transistors 906 to be turned off. Moreover, bootstrapping module 820 can comprise any circuit or device, now known or hereinafter devised, for providing bootstrapping functions for switch circuit 808.

The present invention has been described above with reference to various exemplary embodiments. However, those skilled in the art will recognize that changes and modifications may be made to the exemplary embodiments without departing from the scope of the present invention. For example, the various components may be implemented in alternate ways, such as, for example, by implementing JFET devices for the various switching devices. In addition, one or more additional stages may be included at the input or output of the second stage in accordance with various exemplary embodiments. Further, the various exemplary embodiments can be implemented with other types of operational amplifier circuits in addition to the circuits illustrated above. These alternatives can be suitably selected depending upon the particular application or in consideration of any number of factors associated with the operation of the system. Moreover, these and other changes or modifications are intended to be included within the scope of the present invention, as expressed in the following claims.

What is claimed is:

1. A CDAC circuit configured for correction of gain errors, said CDAC circuit comprising:
   a positive capacitor array comprising N capacitors, said N capacitors having a common side configured for coupling to a pedestal voltage, and another side configured for sampling onto an input signal and a reference signal through control of N switches; and
   an additional capacitor having one side configured for coupling to the pedestal voltage, and another side configured to couple to said input signal during sampling to facilitate reduction of a positive full-scale voltage and thus reduce an operating range of said CDAC circuit to control gain.

2. The CDAC circuit according to claim 1, wherein said additional capacitor can be switched between said input signal and ground to increase an amount of charge sampled to decrease a level of said input signal necessary to achieve full charge levels, and thereby reduce a high-end of said range to less than said reference voltage.

3. The CDAC circuit according to claim 2, wherein said additional capacitor can be switched between said input signal and said reference signal to provide additional charge back to said CDAC circuit, and thereby adjust a low-end of said range.

4. The CDAC circuit according to claim 2, wherein said additional capacitor comprises a capacitance value of approximately between 0.5 pF and 1.1 pF to achieve a range of between approximately 0.3 volts and 2.2 volts.

5. The CDAC circuit according to claim 2, wherein said positive capacitor array is configured to sample on less than all N capacitors within said positive capacitor array to incrementally increase said range and thereby control gain.

6. The CDAC circuit according to claim 5, wherein said CDAC circuit samples with said additional capacitor to provide a course adjustment of gain, and said CDAC circuit samples on less than all said N capacitors to provide a fine adjustment of gain.

7. The CDAC circuit according to claim 1, wherein said CDAC circuit is further configured for offset correction and further comprises:
   a negative capacitor array comprising M capacitors, said M capacitors being configured for coupling to an input signal, ground and a reference signal through control of M switches, wherein said negative capacitor array is configured for sampling with at least one of said M capacitors to said reference signal, and a remainder of said M capacitors to ground to facilitate convergence to a desired offset voltage.

8. The CDAC circuit according to claim 7, wherein said negative capacitor array is configured for incrementally selecting said M capacitors to adjust said offset voltage.

9. The CDAC circuit according to claim 7, wherein said negative capacitor array can comprise an additional capacitor to facilitate bi-directional adjustment to an offset voltage.

10. An analog-to-digital converter circuit, said analog-to-digital converter comprising:

a successive approximation register;

a comparator circuit having an output coupled to said successive approximation register;

an output circuit coupled to said successive approximation register; and a CDAC circuit configured for correction of gain errors, said CDAC circuit coupled to said comparator circuit and comprising:

a positive capacitor array comprising N capacitors, said N capacitors having a common side configured for coupling to a pedestal voltage, and another side configured for sampling onto an input signal and a reference signal through control of N switches; and an additional capacitor having one side configured for coupling to the pedestal voltage, and another side configured to couple to said input signal during sampling to facilitate reduction of a positive full-scale voltage and thus reduce an operating range of said CDAC circuit to control gain.

11. The analog-to-digital converter circuit according to claim 10, wherein said additional capacitor can be switched between said input signal and ground to increase an amount of charge sampled to decrease a level of said input signal necessary to achieve full charge levels, and thereby reduce a high-end of said range to less than said reference voltage.

12. The CDAC circuit according to claim 11, wherein said additional capacitor can be switched between said input signal and said reference signal to provide additional charge back to said CDAC circuit, and thereby adjust a low-end of said range.

13. The CDAC circuit according to claim 11, wherein said additional capacitor comprises a capacitance value of approximately between 0.5 pF and 1.1 pF to achieve a range of between approximately 0.3 volts and 2.2 volts.

14. The CDAC circuit according to claim 11, wherein said positive capacitor array is configured to sample on less than all N capacitors within said positive capacitor array to incrementally increase said range and thereby control gain.

15. The CDAC circuit according to claim 14, wherein said CDAC circuit samples with said additional capacitor to provide a course adjustment of gain, and said CDAC circuit samples on less than all said N capacitors to provide a fine adjustment of gain.

16. The CDAC circuit according to claim 10, wherein said CDAC circuit is further configured for offset correction and further comprises:

a negative capacitor array comprising M capacitors, said M capacitors being configured for coupling to an input signal, ground and a reference signal through control of M switches, wherein said negative capacitor array is configured for sampling with at least one of said M capacitors to said reference signal, and a remainder of said M capacitors to ground to facilitate convergence to a desired offset voltage.

17. The CDAC circuit according to claim 16, wherein said negative capacitor array is configured for incrementally selecting said M capacitors to adjust said offset voltage.

18. The CDAC circuit according to claim 16, wherein said negative capacitor array can comprise an additional capacitor to facilitate bi-directional adjustment to an offset voltage.

19. A method for correction of gain errors in a CDAC circuit, said method comprising the steps of:

sampling an input signal with at least one capacitor in a capacitor array of a positive side of said CDAC circuit;

sampling said input signal with an additional capacitor to increase an amount of charge sampled, thereby decreasing a level of said input signal necessary to achieve full charge levels and decreasing a range of said CDAC circuit.

20. The method according to claim 19, wherein said method further comprises the steps of:

sampling said input signal without at least one capacitor of said capacitor array to incrementally increase said range of said CDAC circuit to thereby control gain.

21. The method according to claim 20, wherein said step of sampling said input signal with said additional capacitor provides a course adjustment, and said step of sampling said input signal without at least one capacitor of said capacitor array comprises a fine adjustment.

22. The method according to claim 19, wherein said method is configured for correction of offset errors and further comprises the step of:

sampling a reference signal with at least one capacitor in a capacitor array of a negative side of said CDAC circuit;

converging said CDAC circuit to an adjusted offset voltage to correct for offset error.

23. A CDAC circuit configured for correction of gain errors, said CDAC circuit comprising:

a positive capacitor array comprising N capacitors configured for sampling onto an input signal through control of N switches; and an additional capacitor configured to facilitate reduction of a positive full-scale voltage and thus reduce an operating range of said CDAC circuit to control gain, said additional capacitor configured for switching between said input signal and ground to increase an amount of charge sampled to decrease a level of said input signal necessary to achieve full charge levels, and thereby reduce a high-end of said range to less than a reference voltage.

24. The CDAC circuit according to claim 23, wherein said positive capacitor array is configured to sample on less than all N capacitors within said positive capacitor array to incrementally increase said range and thereby control gain.

25. A CDAC circuit configured for correction of gain errors, said CDAC circuit comprising:

a positive capacitor array comprising N capacitors, said N capacitors having a first side configured for coupling to a pedestal voltage, and a second side configured for sampling onto an input signal; and an additional capacitor having a first side configured for coupling to the pedestal voltage, and a second side configured to couple to said input signal during sampling to facilitate reduction of a positive full-scale voltage.

* * * * *